US010772229B2

(12) United States Patent
Boeckmann

(10) Patent No.: US 10,772,229 B2
(45) Date of Patent: Sep. 8, 2020

(54) DRIVE CARRIER SNAP SLIDE CLIP

(71) Applicant: EMC IP HOLDING COMPANY LLC, Hopkinton, MA (US)

(72) Inventor: John Boeckmann, Watkins, MN (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 16/257,787

(22) Filed: Jan. 25, 2019

(65) Prior Publication Data
US 2020/0245489 A1 Jul. 30, 2020

(51) Int. Cl.
*H05K 5/00* (2006.01)
*H05K 7/14* (2006.01)
*H05K 7/18* (2006.01)
*H05K 5/02* (2006.01)

(52) U.S. Cl.
CPC .......... *H05K 7/1401* (2013.01); *H05K 5/023* (2013.01); *H05K 5/0221* (2013.01); *H05K 7/183* (2013.01)

(58) Field of Classification Search
None
See application file for complete search history.

(56) References Cited

U.S. PATENT DOCUMENTS

| | | | | | |
|---|---|---|---|---|---|
| 6,955,550 | B2 * | 10/2005 | Schlack | ............... | H05K 7/1409 439/157 |
| 8,456,832 | B1 * | 6/2013 | Brigham, Jr. | ........... | G06F 1/187 361/679.33 |
| 8,749,966 | B1 * | 6/2014 | Boudreau | ............... | G06F 1/187 361/679.33 |
| 10,056,118 | B2 * | 8/2018 | Lu | .......... | G11B 33/12 |
| 10,537,035 | B2 * | 1/2020 | Adrian | ................. | G11B 5/4806 |
| 2009/0129009 | A1 * | 5/2009 | Zhang | .................. | G11B 33/121 361/679.34 |
| 2010/0309621 | A1 * | 12/2010 | Chang | ..................... | G06F 1/187 361/679.39 |
| 2010/0321879 | A1 * | 12/2010 | Peng | ....................... | G06F 1/187 361/679.33 |

\* cited by examiner

*Primary Examiner* — Courtney L Smith
*Assistant Examiner* — Rashen E Morrison
(74) *Attorney, Agent, or Firm* — Anderson Gorecki LLP

(57) ABSTRACT

A snap slide clip provides a secondary securing mechanism for a drive carrier. The drive carrier includes a fastening mechanism to secure the drive carrier to a rack with the mounted drive connected to a storage system. A handle arm actuates a first latch feature to secure the drive carrier to the rack in a closed position and disengages the first latch feature in an open position such that the drive carrier can be moved with respect to the rack. A primary securing mechanism includes a second latch feature that secures the handle arm in a closed position. The snap slide clip is affixed to the primary securing mechanism to prevent the handle arm from moving into the open position in the event of failure of the primary securing mechanism. The snap slide clip can be retrofitted to a drive carrier of an active storage system without disrupting access to storage.

12 Claims, 8 Drawing Sheets

DRIVE CARRIER SNAP SLIDE CLIP

TECHNICAL FIELD

The subject matter of this disclosure is generally related to storage arrays that maintain large active data sets, and more particularly to preventing drives from being disconnected due to drive carrier failures.

BACKGROUND

Large organizations use data centers to maintain their critical data. For example, banks, large retailers, governmental organizations, and multi-national corporations rely on storage arrays to store data required for inventory tracking, accounting, sales, manufacturing, and other critical business functions for which data loss and data unavailability must be avoided. A key building block of a data center is a storage array. Storage arrays manage access to large data sets that are concurrently used by multiple host applications and potentially many users. The data is stored on arrays of non-volatile managed drives such as SSDs (solid-state drives) and HDDs (hard disk drives) that are mounted in racks. The storage array typically includes redundant computing nodes that manage access to the drives. Pairs of computing nodes are configured for failover and provide multiple data paths. It is known to organize the managed drives into RAID (Redundant Array of Independent Drives) groups to avoid data loss in the event of drive failure. Various levels of RAID are known. The different RAID levels use one or more of redundant copies, striping, parity, and other techniques to achieve high data availability and avoid data loss. Further, standby drives can be pre-mounted in the racks and automatically utilized in the event of the failure of other drives. For example, a failed drive can be rebuilt on a standby drive.

SUMMARY

All examples, aspects and features mentioned in this document can be combined in any technically possible way.

The presently disclosed invention is predicated in-part on recognition that certain types of drive carriers are susceptible to a type of failure that allows mounted drives to become disconnected from the storage array under normal operating conditions. From the perspective of the storage array, a disconnected drive resulting from a drive carrier failure appears to be a failed drive, e.g. a drive that has lost the ability to read and write data. Consequently, RAID capabilities are used to automatically rebuild the disconnected drive on a standby drive. However, the number of real drive failures combined with the number of drive carrier failures may result in premature use of all available standby drives. Moreover, replacement of failed drive carriers is disruptive and time-consuming. For example, if replacement of drives carriers requires the storage array to be taken offline then the data maintained by the storage array may become temporarily unavailable.

In accordance with an aspect, an apparatus comprises: a secondary securing mechanism for a drive carrier with a fastening mechanism comprising a handle arm that actuates a first latch feature to secure the drive carrier to a rack in a closed position and disengages the first latch feature in an open position such that the drive carrier can be moved with respect to the rack, a primary securing mechanism comprising a second latch feature that secures the handle arm in a closed position, the secondary securing mechanism being affixed to the primary securing mechanism and preventing the handle arm from moving into the open position. In some implementations the secondary securing mechanism comprises a clip. In some implementations the clip is characterized by a C-shape or U-shape. In some implementations the clip comprises a first cantilevered arm and a second cantilevered arm interconnected by a cross-beam. Some implementations comprise a first hook and a second hook at distal ends of the first cantilevered arm and the second cantilevered arm, respectively. In some implementations the primary securing mechanism comprises a release button that frees the handle arm when depressed, and wherein the first hook and the second hook affix the clip to the release button with a snap fit. In some implementations a portion of the cross-beam overlaps the handle arm. In some implementations the first hook and the second hook prevent depression of release button. In some implementations the cross-beam deflects in response to force to install the clip on the release button. In some implementations the clip slides along grooves of the release button when affixed thereto.

In accordance with an aspect a method comprises: on an active drive array of an active storage system, installing a secondary securing mechanism on a drive carrier of the active drive array, the drive carrier comprising a fastening mechanism comprising a handle arm that actuates a first latch feature to secure the drive carrier to a rack of the drive array in a closed position and disengages the first latch feature in an open position such that the drive carrier can be moved with respect to the rack, a primary securing mechanism comprising a second latch feature that secures the handle arm in a closed position, the secondary securing mechanism being affixed to the primary securing mechanism and preventing the handle arm from moving into the open position, thereby fastening an active drive mounted in the drive carrier in place in the rack without removing the drive from the rack. In some implementations the secondary securing mechanism comprises a clip and the method comprises snap-fitting the clip to the drive carrier. In some implementations the clip comprises a first cantilevered arm and a second cantilevered arm interconnected by a cross-beam to form a C-shape or U-shape, a first hook and a second hook at distal ends of the first cantilevered arm and the second cantilevered arm, respectively, and comprising snap-fitting the first and second hooks to the drive carrier. In some implementations the primary securing mechanism comprises a release button that frees the handle arm when depressed, and the method comprises snap fitting the first hook and the second hook to the release button with a snap fit such that a portion of the cross-beam overlaps the handle arm. In some implementations the primary securing mechanism comprises a release button that frees the handle arm when depressed and the method comprises sliding the clip along grooves of the release button until a portion of the cross-beam beam overlaps the handle arm.

In accordance with an aspect an apparatus comprises: a secondary securing mechanism for a drive carrier with a fastening mechanism comprising a handle arm that actuates a first latch feature to secure the drive carrier to a rack in a closed position and disengages the first latch feature in an open position such that the drive carrier can be moved with respect to the rack, a primary securing mechanism comprising a second latch feature that secures the handle arm in a closed position, the secondary securing mechanism comprising a snap slide clip retrofitted to the primary securing mechanism while an active drive is mounted in the drive carrier to prevent the handle arm from moving into the open position. In some implementations the snap slide clip comprises a first cantilevered arm and a second cantilevered arm interconnected by a cross-beam, and a first hook and a second hook at distal ends of the first cantilevered arm and the second cantilevered arm, respectively. In some implementations the primary securing mechanism comprises a release button that frees the handle arm when depressed, and wherein the first hook and the second hook affix the snap slide clip to the release button with a snap fit. In some implementations a portion of the cross-beam overlaps the handle arm. In some implementations the snap slide clip slides along grooves of the release button when snap-fitted thereto.

Other aspects, features, and implementations may become apparent in view of the detailed description and figures.

DETAILED DESCRIPTION

Aspects of the inventive concepts will be described as being implemented in a data storage system that includes a host server and storage array. Such implementations should not be viewed as limiting. Those of ordinary skill in the art will recognize that there are a wide variety of implementations of the inventive concepts in view of the teachings of the present disclosure.

Some aspects, features, and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium.

Furthermore, it will be understood by those of ordinary skill in the art that the computer-executable instructions may be executed on a variety of tangible processor devices, i.e. physical hardware. For ease of exposition, not every step, device or component that may be part of a computer or data storage system is described herein. Those of ordinary skill in the art will recognize such steps, devices and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "storage array" and "solid-state drive" are intended to include all storage nodes and storage components in which the inventive concepts may be implemented. The terms "logical" and "virtual" are used to refer to features that are abstractions of other features, e.g. and without limitation abstractions of tangible features. The term "physical" is used to refer to tangible features, including but not limited to electronic hardware. For example, multiple virtual computing devices could operate simultaneously on one physical computing device. The term "logic" is used to refer to special purpose physical circuit elements, firmware, software, computer instructions that are stored on a non-transitory computer-readable medium and implemented by multi-purpose tangible processors, and any combinations thereof.

Figure 1:
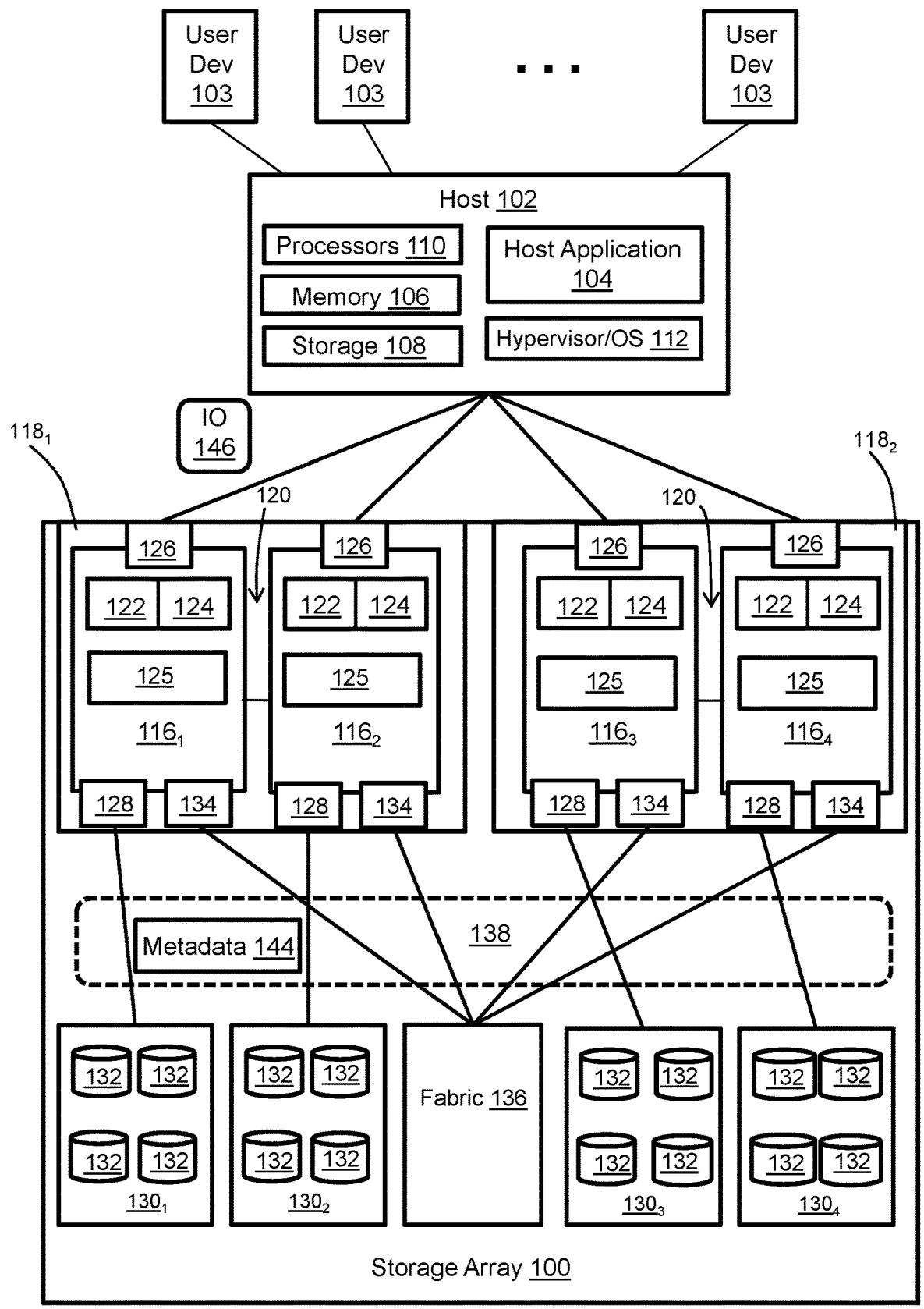
FIG. 1 illustrates a storage array connected to a host for supporting user devices.

FIG. 1 illustrates a data center that includes a storage array 100 that is connected to a host 102. There would typically be multiple hosts and storage arrays in the data center, but the example is simplified to facilitate illustration of salient aspects. Each of the hosts that are connected to the storage array, of which host 102 is representative, may support multiple user devices 103. Host 102 may be a type of server computer that includes volatile memory 106, non-volatile storage 108, one or more tangible processors 110, and a hypervisor or OS (Operating System) 112. The volatile memory 106 may include RAM (Random Access Memory) of any type. The non-volatile storage 108 may include drives of one or more technology types, for example, and without limitation, SSDs (Solid State Drives) such as flash, and HDDs (Hard Disk Drives) such as SATA (Serial Advanced Technology Attachment) and FC (Fibre Channel). Although an external host server is illustrated, internal hosts may be instantiated within the storage array.

The storage array 100 includes a plurality of interconnected computing nodes $116_1$-$116_4$ that maintain data on, and control access to, managed drives 132. Each computing node includes at least one multi-core processor 122 and local volatile memory 125. The computing nodes may also include one or more layers of cache. The local volatile memory 125 may include, for example and without limitation, components such as RAM of any type. Each computing node may also include one or more FAs 126 (Front-end Adapters) for communicating with the host 102. Each computing node $116_1$-$116_4$ may also include one or more BAs 128 (Back-end Adapters) for communicating with respective associated drive arrays $130_1$-$130_4$, thereby enabling access to the managed drives 132. The managed drives 132 may include tangible persistent data storage components of one or more technology types, for example, and without limitation, SSDs such as flash and SCM (Storage Class Memory), and HDDs such as SATA and FC. Each drive array would typically include 24 or more managed drives, but the figure is simplified for purposes of illustration. Because the storage array and/or data center may include hundreds or thousands of individual drives, systemic problems associated with drives can be logistically problematic. Each computing node may also include one or more CAs (Channel Adapters) 134 for communicating with other computing nodes via an interconnecting fabric 136. Each computing node may allocate a portion or partition of its respective local volatile memory 125 to a virtual shared memory 138 that can be accessed by other computing nodes, e.g. via DMA (Direct Memory Access) or RDMA (Remote Direct Memory Access). Pairs of the computing nodes, e.g. ($116_1$, $116_2$) and ($116_3$, $116_4$), may be organized as storage engines $118_1$, $118_2$, respectively, for purposes of failover between computing nodes. The paired computing nodes of each storage engine may be directly interconnected by communication links 120.

One function of the storage array 100 is to maintain data for instances of a host application 104 running on the host 102. Specifically, host application data is maintained on the managed drives 132. Examples of host applications may include but are not limited to file servers, email servers, block servers, and databases. The managed drives 132 are not discoverable by the host 102 but the storage array 100 maintains a logical production device 140 that can be discovered and accessed by the host 102. Without limitation, the production device 140 may be referred to as a production volume or production LUN, where LUN (Logical Unit Number) is a number used to identify the logical storage volume in accordance with the SCSI (Small Computer System Interface) protocol. From the perspective of the host 102, the production device 140 is a single data storage device having a set of contiguous fixed-size LBAs (logical block addresses) on which data used by instances of the host application resides. However, the host application data is stored at non-contiguous addresses on various different managed drives 132 that are abstracted by the production volume.

In order to service IOs from instances of the host application 104, the storage array 100 maintains metadata 144 that indicates, among various things, mappings between LBAs of the production device 140 and addresses with which extents of host application data can be accessed from the shared memory 138 and managed drives 132. In response to a data access instruction from an instance of the host application 104, the hypervisor/OS 112 initially determines whether the instruction can be serviced by accessing the host server memory 106. If that is not possible then an IO 146 is sent from the host 102 to the storage array 100. There are multiple paths between the host 102 and the storage array 100, e.g. one path per FA 126. The paths may be selected based on a wide variety of techniques and algorithms including, for context and without limitation, performance and load balancing. In the case of an IO to read data from the production device the storage array uses the metadata 144 to find the requested data in the shared memory 138 or managed drives 132. More particularly, if the requested data is not in the shared memory 138 then the requested data is temporarily copied into the shared memory from the managed drives 132 and used to service the IO, i.e. reply to the host application with the data via one of the computing nodes. In the case of an IO to write data to the production device the storage array copies the data into shared memory, marks the corresponding production device location as dirty in the metadata, and creates new metadata that maps the production device address with a location to which the data is eventually written on the managed drives. The shared memory may enable the production device to be reachable via all of the computing nodes and paths, although the storage array can be configured to limit use of certain paths to certain production devices.

Figure 2:
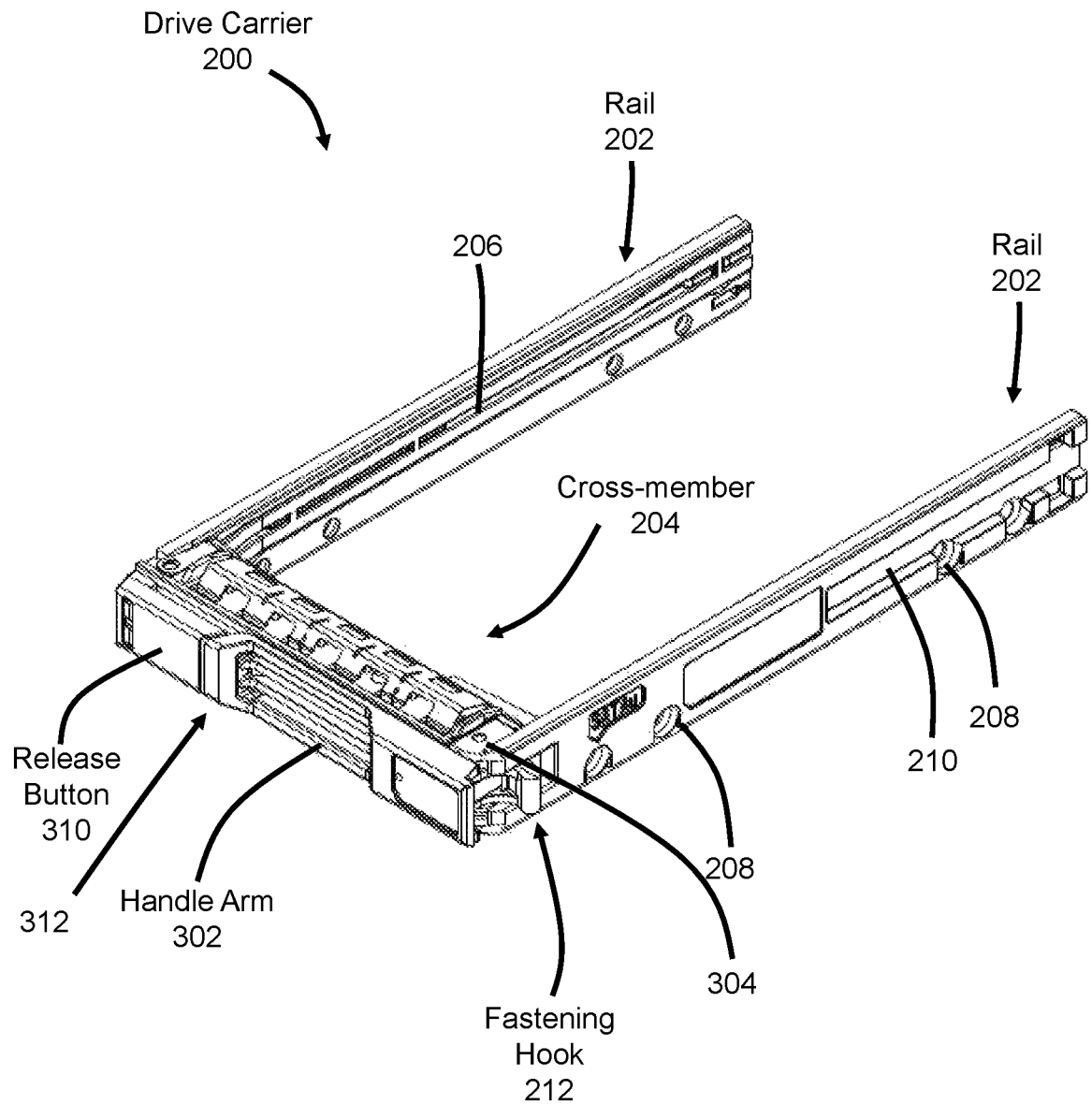
FIG. 2 illustrates a drive carrier.

FIG. 2 illustrates a drive carrier 200 of the storage array. Each managed drive of the storage array is mounted in one of the drive arrays using a drive carrier. The drive carrier maintains the mounted drive in alignment with an interconnecting backplane or midplane via which the drive can be accessed by a BA. In other words, the drive carrier maintains alignment of an electrical interface of the drive with an electrical interface of the interconnection system. The drive carrier also allows the drive to slide in and out of the rack for service and replacement.

Figure 3:
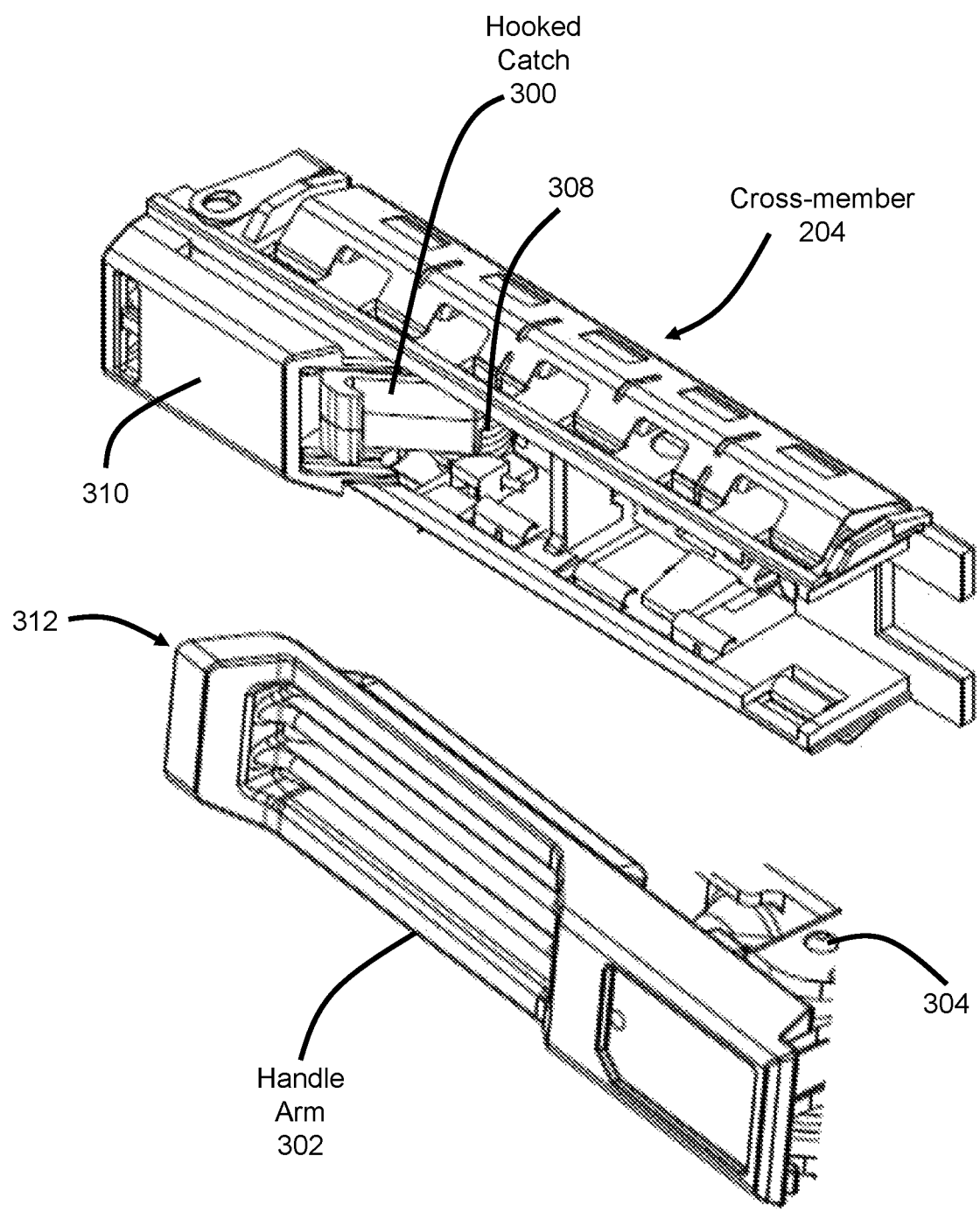
FIG. 3 illustrates the primary locking system of the drive carrier.

Referring to FIGS. 2 and 3, the drive carrier 200 includes two rails 202 and an interconnecting cross-member 204. The cross-member 204 is connected to distal ends of the rails 202. The rails include features such as grooves 206 and holes 208 for fasteners via which the drive is mounted in the drive carrier. The rails 202 include outer grooves 210 or other features for aligning the drive carrier with the rack. The outer grooves 210 enable the drive carrier 200 to slide into and out of the rack such that a drive can be mounted in, or removed from, a drive carrier that has been pulled out of the rack. Further, a mounted drive can be connected to the storage system by sliding the drive carrier with the mounted drive into the rack, thereby engaging the electric connectors of the drive with the interconnection system. The drive carrier may be formed of metal, polycarbonate, or other suitable material for providing secure positioning of the mounted drive for proper alignment. The dimensions of the drive carrier may be selected in accordance with the dimensions of the rack system in which the drive carrier is mounted.

The cross-member 204 includes a fastening mechanism to prevent the drive carrier, and thus the mounted drive, from inadvertently sliding out of the rack. In the illustrated example the fastening mechanism includes a fastening hook 212 that engages with a keeper on the rack. The fastening hook 212 is coupled to a handle arm 302. The handle arm 302 pivots at a hinge 304 located proximate to a distal end of the cross-member. More specifically, the handle arm 302 pivots between open and closed positions. When the handle arm is in the closed position the fastening hook 212 protrudes from the cross-member to engage the rack keeper. In the closed position specifically illustrated in FIG. 2 the fastening hook 212 causes the drive carrier to be secured in place relative to the rack so that the drive carrier does not slide out of the rack. When the handle arm 302 is moved into an open position the fastening hook 212 recedes into the cross-member and disengage the rack keeper. Thus, the handle arm 302 is used to engage and disengage the fastening mechanism. The handle arm 302 can also be used to push and pull the drive carrier into and out of the rack.

A primary securing mechanism is used to secure the handle arm in the closed position, i.e. to secure the fastening mechanism in an engaged state. The primary securing mechanism includes a hooked catch 300 and a corresponding keeper (e.g. a slot) at the free end 312 of the handle arm 302. The free end 312 of the handle arm 302 opposite to the hinge 304 is retained in the closed position by the hooked catch 300 and keeper, which form the primary securing mechanism. The hooked catch is in a fixed position on the cross-member 204 and pivots at a hinge. The pivotal range of movement of the hooked catch may be limited. A spring 308 holds the hooked catch at the limit of the pivotal range. When the free end 312 of the handle arm 302 is pressed against the cross-member the hooked catch pivots against the spring force and then snaps back as it engages the keeper. Engagement of the hooked catch with the keeper is maintained by force from the spring 308. The fastening hook 212 proximate to the base of the handle arm engages the rack keeper when the handle arm is in the closed secured position, and thus when the hooked catch 300 engages the handle arm keeper, thereby securing the drive carrier from sliding out of the rack in the closed secured position.

A release button 310 connected to the cross-member is operationally connected to the hooked catch 300 of the primary securing mechanism. Pressing the release button 310 causes the hooked catch to temporarily pivot against the spring force, thereby disengaging the hooked catch from the handle arm keeper and freeing the handle arm 302. When the free end 312 of the handle arm is pivoted away from cross-member 204 the fastening hook 212 is disengaged from the rack keeper, thereby allowing the drive carrier to freely slide out of the rack. When a new drive is mounted in the drive carrier, the drive is slid into the rack, thereby establishing electrical connection with the interconnection system, and the fastening mechanism is engaged by pushing the handle arm against the hooked catch until the hooked catch engages the keeper. When a drive is being removed, the release button is pressed to disengage the hooked catch from the keeper and the free end of the handle arm is pivoted outward until the slide latching mechanism is disengaged. The drive carrier can then be slid out of the rack with the mounted drive.

A shortcoming of the illustrated drive carrier is that it requires relatively stringent manufacturing tolerances. For example, if the spring force is too weak or if the hooked catch and handle arm keeper are slightly misaligned or lack the required dimensions or strength then the drive carrier can become inadvertently unlocked during normal operation of the storage system. Although the mounted drive may not slide far out of the rack, a drive carrier with a failed primary securing mechanism can permit the drive to become electrically disconnected or intermittently disconnected from the interconnection system. Such a disconnected drive appears to the storage array as being a failed drive.

Figure 4:
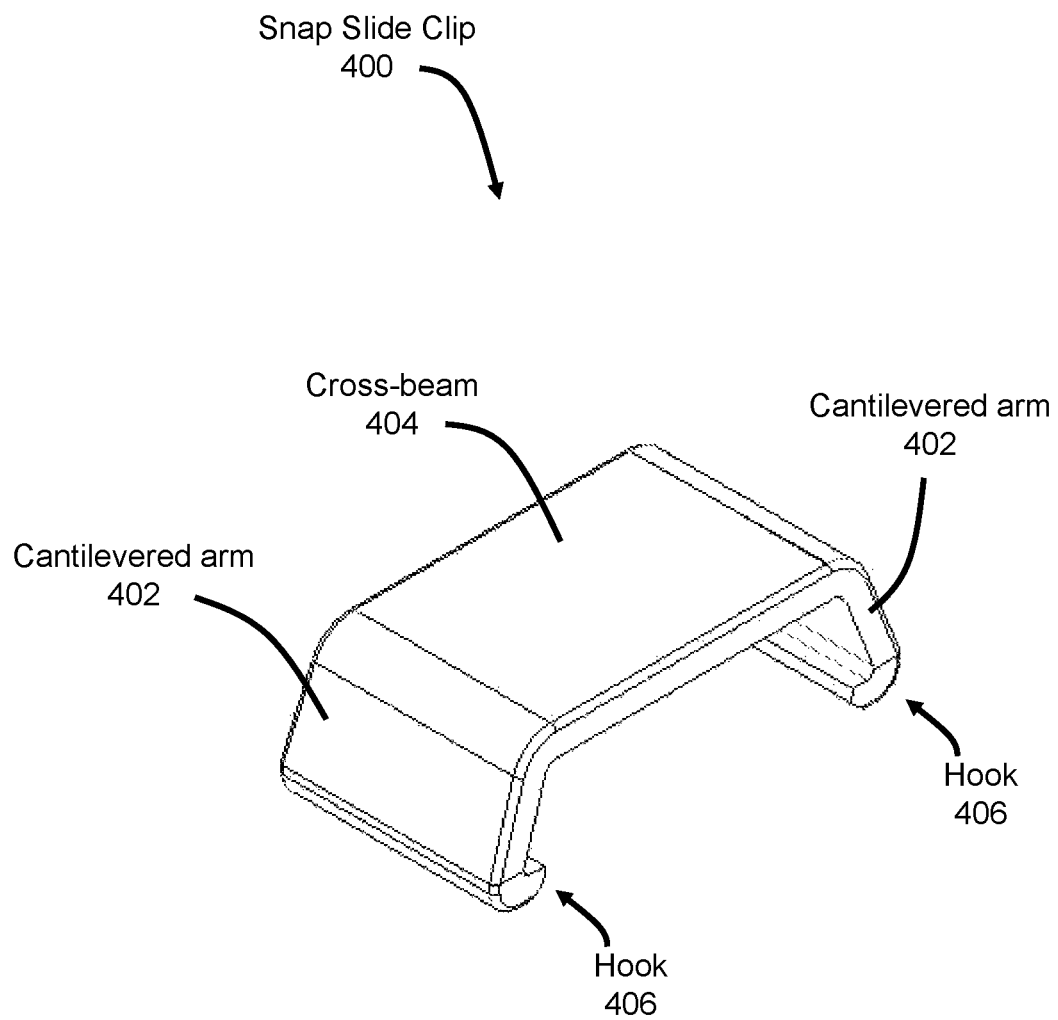
FIGS. 4 and 5 illustrate a snap slide clip that provides a secondary securing mechanism for the drive carrier.
Figure 5:
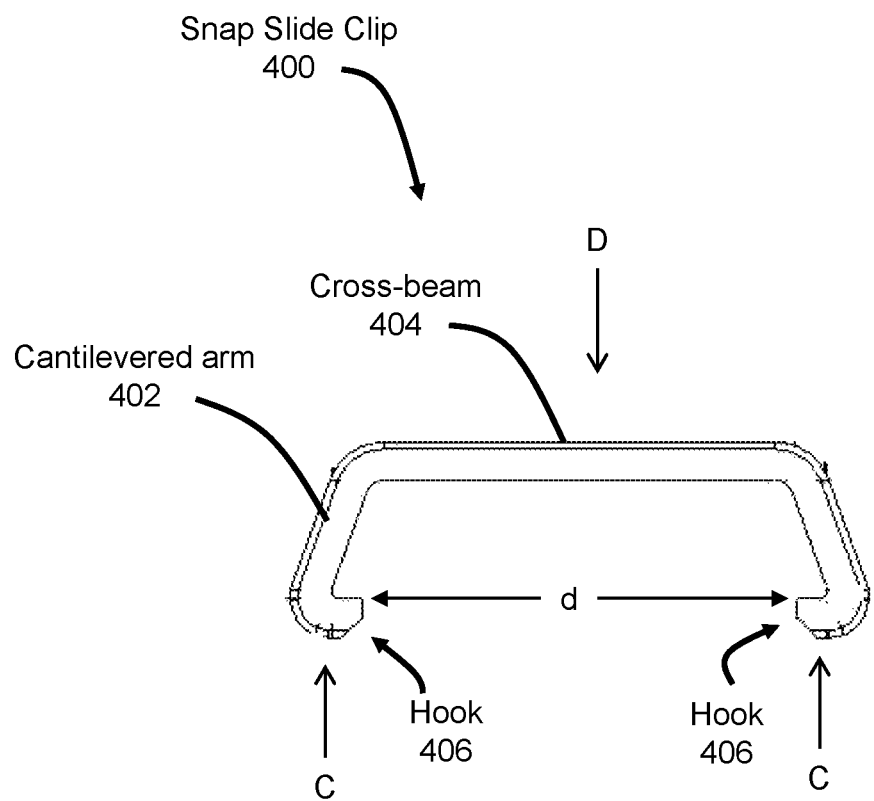

FIGS. 4 and 5 illustrate a snap slide clip 400 that provides a secondary securing mechanism for the drive carrier. The snap slide clip functions by preventing the handle arm from pivoting away from the cross-member even if the primary securing mechanism fails. The snap slide clip includes two cantilevered arms 402 that extend from and are interconnected by a cross-beam 404. The illustrated cantilevered arms 402 are angled relative to the cross-beam 404, e.g. forming a U or C shape. A wide variety of angular relationships between the arms and cross-beam may be implemented, and the cross-beam and arms could be formed with a continuous or partial curvature. Hooks 406 are formed at distal ends of the cantilevered arms 402. The cross-beam and cantilevered arms are resilient and deflectable such that the distance d between the hooks 406 can be temporarily changed by deflection of the cross-beam and arms. For example, a deflection force D causes the distance d between the hooks to temporarily increase when there is a counter force C against the portion of the arms proximate to the hooks. As will be explained below, the deflection force D may be applied by hand to form a snap fit between the release button and the snap slide clip. Suitable materials include polycarbonate.

Figure 6:
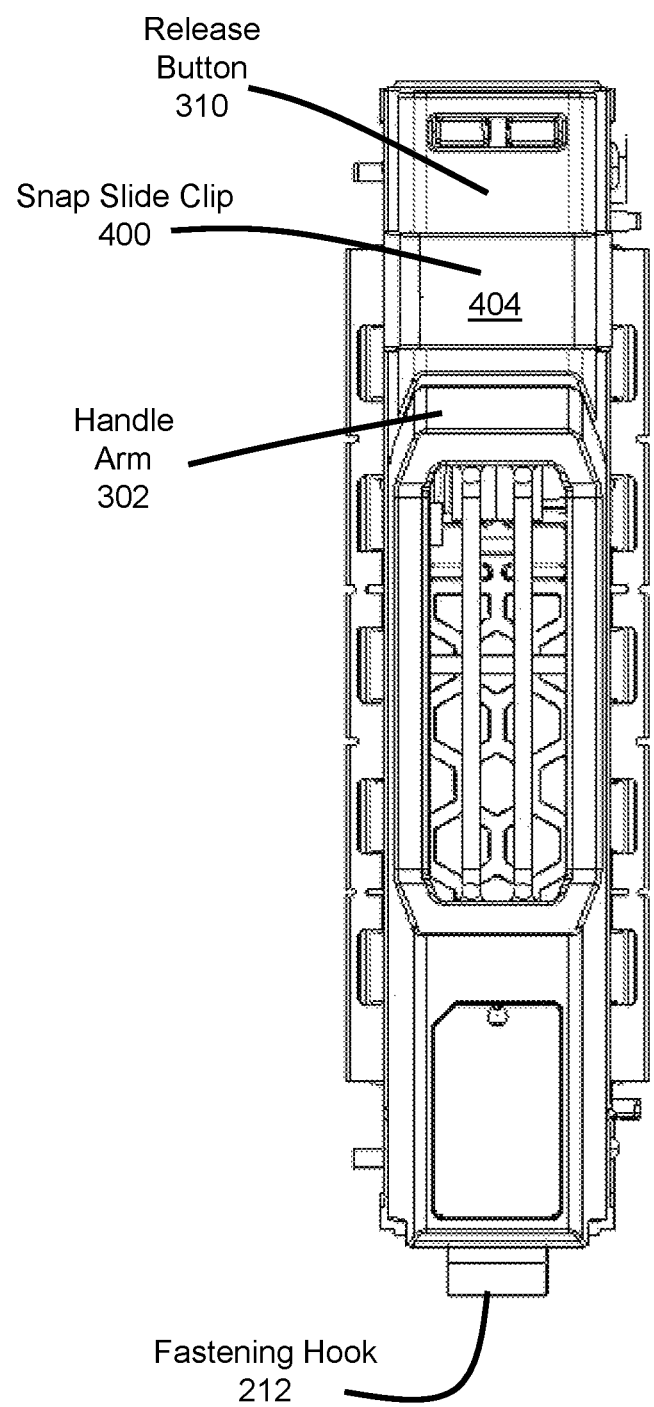
FIGS. 6 and 7 illustrate the snap slide clip mounted on the drive carrier in a non-locking position.
Figure 7:
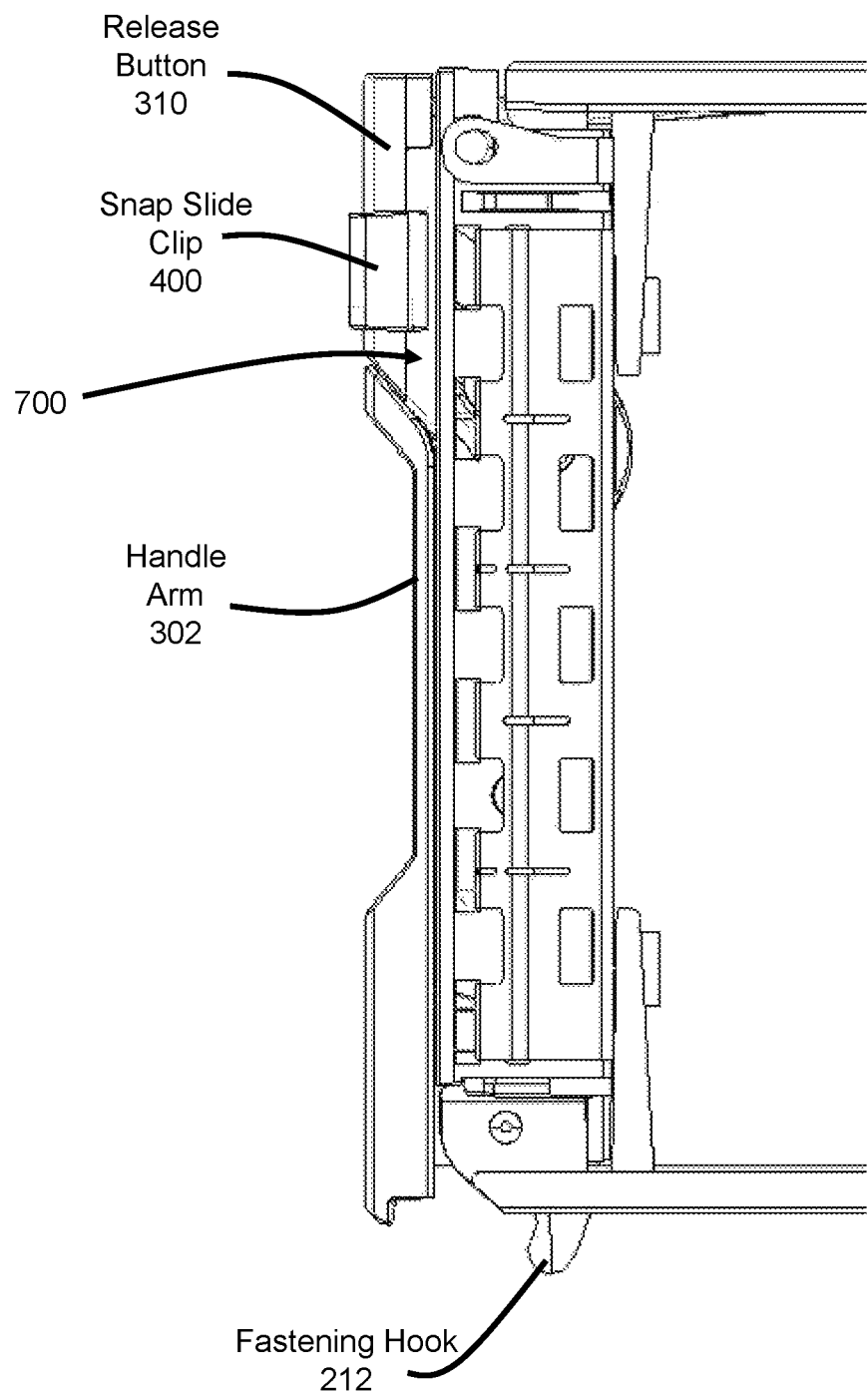

FIGS. 6 and 7 illustrate the snap slide clip 400 mounted on the drive carrier in a non-locking position. A snap fit has been implemented between the snap slide clip and the release button 310 by pressing the snap slide clip against the release button with the hooks in contact with outer edges of the release button, thereby deflecting the cross-beam and temporarily increasing the distance between the hooks until the hooks move from the front surface of the release button to the rear surface of the release button. A groove 700 is formed on each side of the release button where a gap is necessary between the release button and the cross-member so that the release button can be depressed. When installed as shown the distance between the hooks is the normal non-deflected distance. A depth dimension between the contact surface of the hooks and the contact surface of the cross-member against the groove is selected such that the snap slide clip is freely slidable along the length of the release button with little or no free play.

Figure 8:
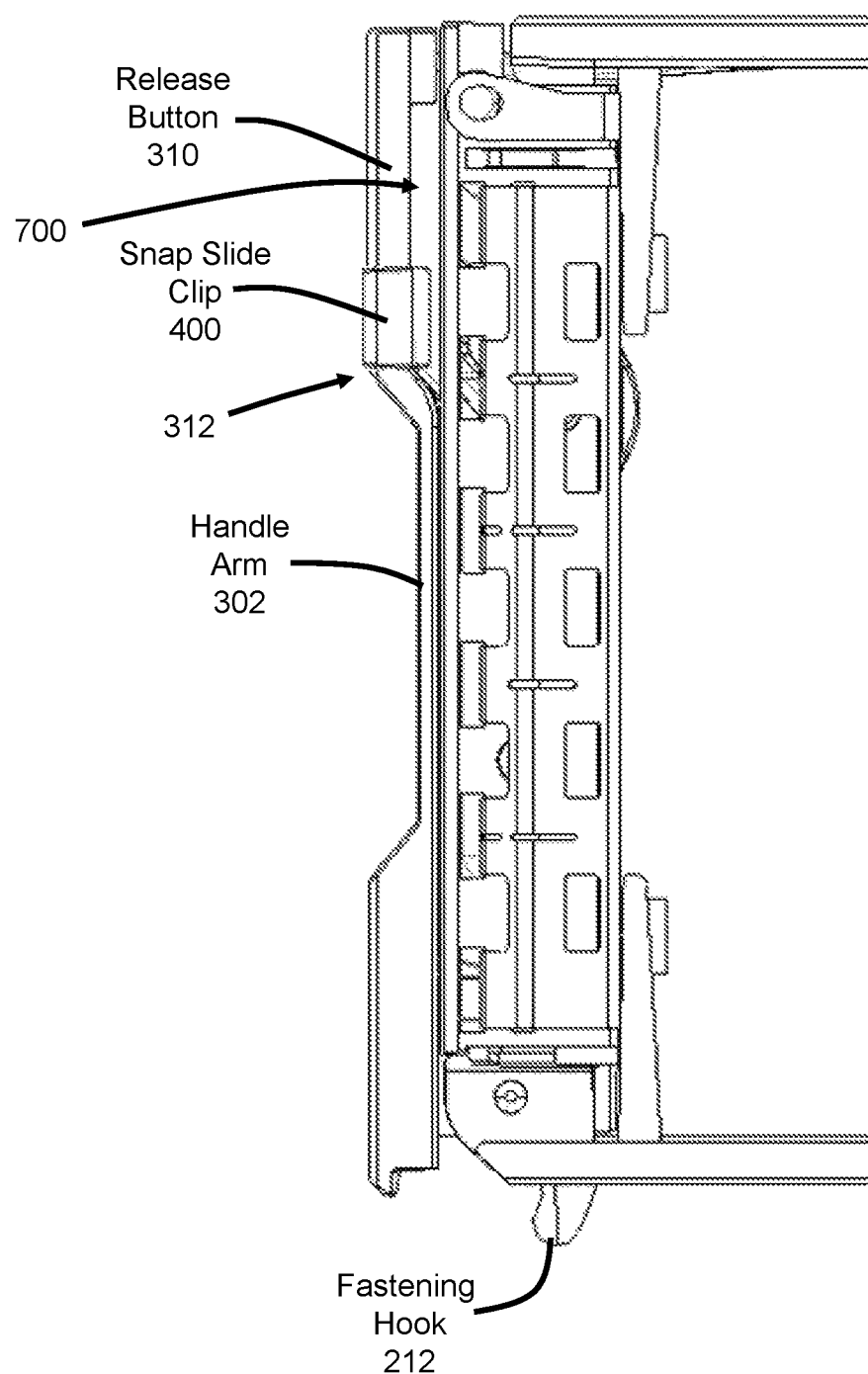
FIG. 8 illustrates the snap slide clip mounted on the drive carrier in a locking position.

FIG. 8 illustrates the snap slide clip 400 mounted on the drive carrier in a locking position. To move the snap slide clip into the locking position the snap slide clip 400 is slid along the release button 310 lengthwise until at least a first portion of the cross-beam overlaps the free end 312 of the handle arm 302. At least a second portion of the snap slide clip 400 cross-beam overlaps the release button such that the snap slide clip is retained in place by the snap fit against the release button. The presence of the snap slide clip hooks in the groove 700 prevents the release button from being depressed. The first portion of the cross-beam that overlaps the free end of the handle arm prevents the free end of the handle arm from pivoting away from the cross member even if the hooked catch of the primary securing mechanism disengages from the keeper due to failure of the primary securing mechanism. Consequently, the slide latching hook 212 will not become disengaged from the rack keeper due to failure of the primary securing mechanism. The snap slide clip can be removed from the drive carrier by deflecting the cross-beam and arms to increase the distance between the hooks until the snap fit is released.

Advantages associated with the snap slide clip include low cost and the ability to retrofit existing drive arrays without replacing the drive carriers and without taking the storage array offline. The snap slide clips can be easily and quickly installed and removed at the location of the storage array without need for skilled technicians, such as would be required to replace the drive carriers. Thus, the incidence of drives becoming inadvertently disconnected from the storage array is reduced.

Specific examples have been presented to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:

1. An apparatus comprising:
a secondary securing mechanism for a drive carrier with a fastening mechanism comprising a first latch feature that is actuated by a handle arm to secure the drive carrier to a rack in a closed position and to disengage from the rack in an open position such that the drive carrier can be moved with respect to the rack and a primary securing mechanism comprising a second latch feature that secures the handle arm in a closed position and a release button that frees the handle arm when depressed, the secondary securing mechanism comprising:
a clip comprising:
a first cantilevered arm and a second cantilevered arm interconnected by a cross-beam; and
a first hook and a second hook at distal ends of the first cantilevered arm and the second cantilevered arm, respectively;
wherein the clip is configured to be affixed to the primary securing mechanism such that the first hook and the second hook affix to the release button with a snap fit, the secondary securing mechanism thereby preventing the handle arm from moving into the open position when the handle arm is unlatched from the second latch feature.

2. The apparatus of claim 1 wherein the clip is characterized by a C-shape or U-shape.

3. The apparatus of claim 1 wherein a portion of the cross-beam overlaps the handle arm.

4. The apparatus of claim 1 wherein the first hook and the second hook prevent depression of the release button.

5. The apparatus of claim 1 wherein the cross-beam deflects in response to force to install the clip on the release button.

6. The apparatus of claim 1 wherein the clip slides along grooves of the release button when affixed thereto.

7. A method comprising:

on an active drive array of an active storage system, installing a secondary securing mechanism on a drive carrier of the active drive array, the drive carrier comprising a fastening mechanism comprising a first latch feature that is actuated by a handle arm to secure the drive carrier to a rack of the drive array in a closed position and to disengage from the rack in an open position such that the drive carrier can be moved with respect to the rack and a primary securing mechanism comprising a second latch feature that secures the handle arm in a closed position and a release button that frees the handle arm when depressed, the secondary securing mechanism comprising a first cantilevered arm and a second cantilevered arm interconnected by a cross-beam to form a C-shape or U-shape and a first hook and a second hook at distal ends of the first cantilevered arm and the second cantilevered arm, respectively, wherein installing the secondary securing mechanism comprises snap-fitting the first and second hooks to the drive carrier release button such that a portion of the cross-beam overlaps the handle arm, thereby affixing the secondary securing mechanism to the primary securing mechanism without removing the drive from the rack and preventing the handle arm from moving into the open position when the handle arm is unlatched from the second latch feature, thereby fastening an active drive mounted in the drive carrier in place in the rack without removing the drive from the rack.

8. The method of claim 7 wherein the secondary securing mechanism comprises a clip and comprising snap-fitting the clip to the drive carrier.

9. The method of claim 7 wherein the primary securing mechanism comprises a release button that frees the handle arm when depressed and comprising sliding the clip along grooves of the release button until a portion of the cross-beam overlaps the handle arm.

10. An apparatus comprising:

a secondary securing mechanism for a drive carrier with a fastening mechanism comprising a first latch feature that is actuated by a handle arm to secure the drive carrier to a rack in a closed position and to disengage from the rack in an open position such that the drive carrier can be moved with respect to the rack and a primary securing mechanism comprising a second latch feature that secures the handle arm in a closed position and a release button that frees the handle arm when depressed, the secondary securing mechanism comprising a snap slide clip comprising a first cantilevered arm and a second cantilevered arm interconnected by a cross-beam and a first hook and a second hook at distal ends of the first cantilevered arm and the second cantilevered arm, respectively, wherein the first hook and the second hook are configured to affix the snap slide clip to the release button with a snap fit and the snap slide clip is configured to be retrofitted to the primary securing mechanism while an active drive is mounted in the drive carrier to prevent the handle arm from moving into the open position when the handle arm is unlatched from the second latch feature.

11. The apparatus of claim 10 wherein a portion of the cross-beam overlaps the handle arm.

12. The apparatus of claim 10 wherein the snap slide clip slides along grooves of the release button when snap-fitted thereto.

* * * * *